United States Patent [19]

Schutten et al.

[11] Patent Number: 4,577,208
[45] Date of Patent: Mar. 18, 1986

[54] BIDIRECTIONAL POWER FET WITH INTEGRAL AVALANCHE PROTECTION

[75] Inventors: Herman P. Schutten, Milwaukee, Wis.; Robert W. Lade, Fort Myers, Fla.; James A. Benjamin, Waukesha, Wis.

[73] Assignee: Eaton Corporation, Cleveland, Ohio

[21] Appl. No.: 421,932

[22] Filed: Sep. 23, 1982

[51] Int. Cl.[4] .......................................... H01L 29/78
[52] U.S. Cl. ..................................... 357/23.4; 357/13; 357/41; 357/55; 357/23.8
[58] Field of Search ...... 357/23 VD, 23 MG, 23 HV, 357/39, 41, 53, 55, 47, 13

[56] References Cited

U.S. PATENT DOCUMENTS

| | | | |
|---|---|---|---|
| 2,994,811 | 8/1961 | Senitzky | 357/55 |
| 4,079,403 | 3/1978 | Temple | 357/13 |
| 4,163,988 | 8/1979 | Yeh et al. | 357/23 VD |
| 4,199,774 | 4/1980 | Plummer | 357/41 |
| 4,292,646 | 9/1981 | Assour | 357/13 |
| 4,300,150 | 11/1981 | Colak | 357/52 |
| 4,364,073 | 12/1982 | Becke et al. | 357/23 VD |

FOREIGN PATENT DOCUMENTS 0073585  6/1979  Japan ....................... 357/39

OTHER PUBLICATIONS

IEEE Transactions on Electron Devices, vol. ED 25, #10, "Non Planar Power FETs", by Salama et al., Oct. 1978.

*Integrated Circuits*, by Warner, p. 67, McGraw Hill, 1965.

C. Hu, "A Parametric Study of Power MOSFETs", IEEE Electron Device Conference, Paper CH1461-3/79, 0000-0385.

Ammar & Rogers, "UMOS Transistors on Silicon", Transactions IEEE, ED-27, pp. 907-914, May, 1980.

*Primary Examiner*—Andrew J. James
*Assistant Examiner*—Mark Prenty
*Attorney, Agent, or Firm*—Andrus, Sceales, Starke & Sawall

[57] ABSTRACT

Lateral FET structure is disclosed for bidirectional power switching, including AC application. Integral avalanche protection is provided by a pair of isolation regions forming protective barrier junctions with a common layer, which junctions are in parallel with the reverse blocking junctions of the power FET in the OFF state and have a lower reverse breakover threshold for protecting the latter. A plurality of integrated FETs each have left and right source regions and left and right channel regions with a common drift region therebetween, and conduct current in either direction according to the polarity of main terminals.

19 Claims, 2 Drawing Figures

BIDIRECTIONAL POWER FET WITH INTEGRAL AVALANCHE PROTECTION

TECHNICAL FIELD

The invention relates to power switching semiconductors, and more particularly to power MOSFETs (metal oxide semiconductor field effect transistors), and the like.

BACKGROUND AND SUMMARY

The present invention relates to an improvement providing integral avalanche protection for AC power FET structure such as shown in copending application Ser. Nos. 390,719 now abandoned and 390,479, filed June 21, 1982. These applications disclose lateral FET structure for bidirectional power switching, including AC application. Laterally spaced source regions and channel regions have a common drift region therebetween. Upon application of voltage of either polarity across main terminals connected to the source regions, current flow in either direction is controlled by the potential on gate electrode means proximate the channels.

The latter application shows notch gate structure wherein a notch extends downwardly from a top major surface to separate right and left source regions and right and left channel regions, and direct the drift region current path between the channels around the bottom of the notch. Gate electrode means is provided in the notch proximate the channels for controlling bidirectional conduction. In the OFF state of the FET, a reverse biased junction between the drift region and one FET channel blocks current flow toward one main terminal, and another reverse biased junction between the drift region and the other FET channel blocks current flow in the other direction towards the other main electrode.

A need has arisen in some implementations for protecting the reverse blocking junctions in the OFF state of the FET from transients or other overvoltage conditions causing avalanche breakdown. The present invention addresses and solves this need by providing integral avalanche protection for each of the junctions in the OFF state. Respective integral barrier junctions are provided in parallel with the respective blocking junctions in the OFF state and have a lower reverse breakover threshold, to conduct current in a bypass path around the blocking junctions to thus protect the latter.

In the preferred embodiment, a bottom layer is disposed beneath the drift region and is of opposite conductivity type. A pair of isolation regions of the same conductivity type as the drift region and the source regions are isolated from the source regions, channel regions and drift region by respective isolation moats extending down from a top major surface into the bottom layer. A first main electrode contacts the first source region and first channel region, and a second main electrode contacts the second source region and second channel region. Each main electrode also contacts a respective isolation region. The alternate bypass path between the main terminals is from one isolation region through the common bottom layer to the other isolation region, which path is in parallel with the FET path between the main terminals.

DETAILED DESCRIPTION

Figure 1:
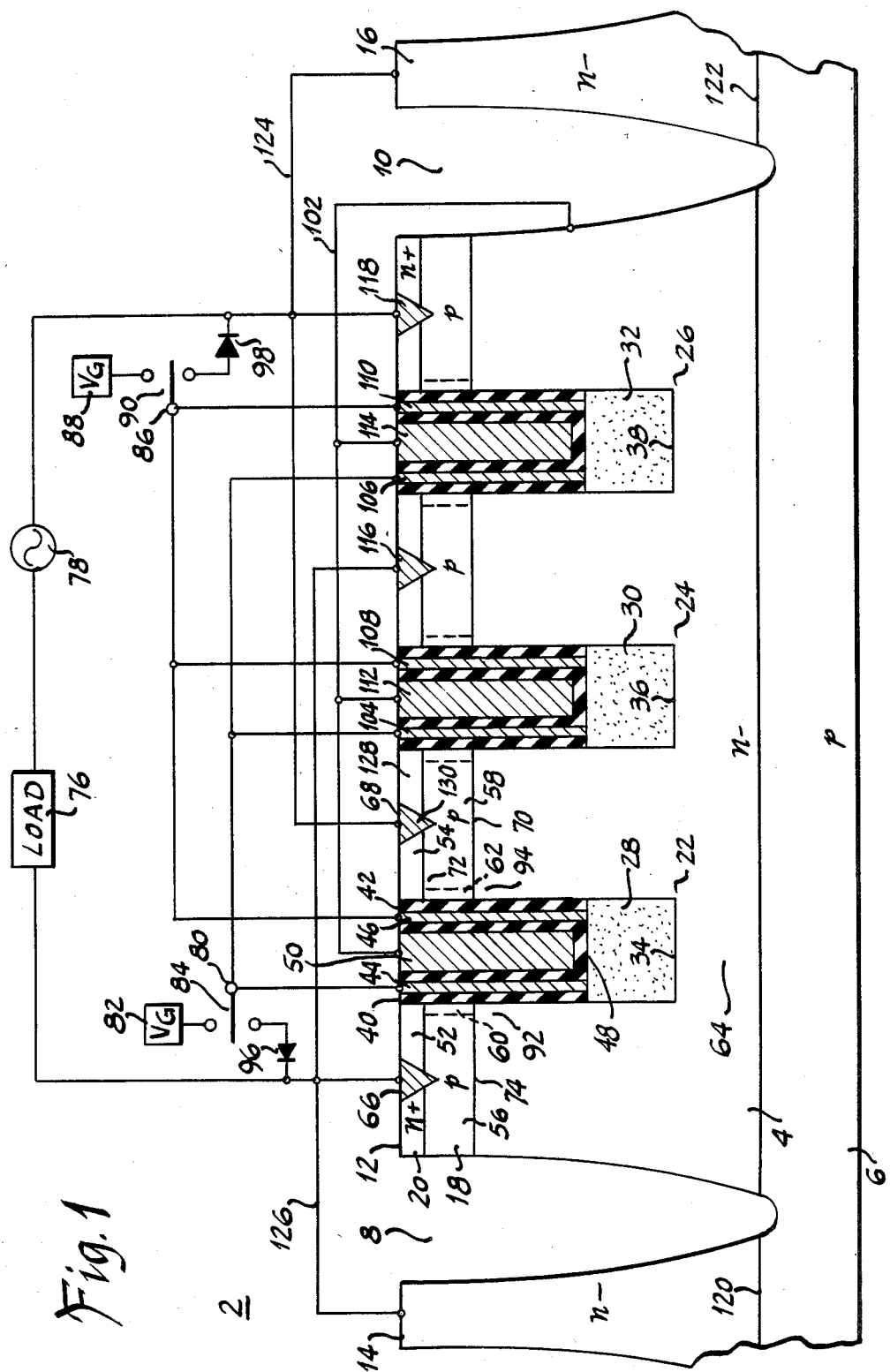
FIG. 1 is a schematic sectional view of bidirectional power FET structure constructed in accordance with the invention.

FIG. 1 shows lateral bidirectional power FET structure 2 including a substrate 4 of one conductivity type, such as n type, having a bottom layer 6 of opposite conductivity type, such as p type, A pair of grooves or isolation moats 8 and 10 are etched from top major surface 12 down through substrate 4 into layer 6, yielding isolation regions 14 and 16. A top p layer 18 is diffused or grown into the substrate from top major surface 12 followed by ion implantation and/or diffusion of an n+ top layer 20.

A plurality of notches 22, 24, 26 and so on, are formed in the substrate from top major surface 12 through n+ top layer 20 and through p top layer 18 into substrate region 4. These notches may be anisotropically etched, as known in the art: C. Hu, "A Parametric Study of Power MOSFETs", IEEE Electron Device Conference, Paper CH1461-3/79, 0000-0385; IEEE Transactions Electron Devices, Vol. ED-25, No. 10, October, 1978; and Ammar and Rogers, "UMOS Transistors on Silicon", Transactions IEEE, ED-27, pages 907–914, May, 1980. Alternatively, the notches may be formed by a porous silicon region in accordance with the known anodization technique of passing a fixed current through the localized region in the presence of concentrated hydrogen fluoride to create a structural change in the silicon which remains single crystalline with the substrate but becomes porous. In the case of anisotropic etching, the bottom of the notch is filled with insulative material. In the case of anodization, the substrate is subjected to an oxidizing atmosphere such that the oxygen enters the pores in the porous notched regions and rapidly oxidizes these regions as shown at 28, 30, 32 and so on, which regions are still single crystalline with substrate 4 but substantially nonconductive. Before or after the anodization, the notches are etched down to levels 34, 36, 38 and so on.

In notch 22, silicon dioxide insulating layers 40 and 42 are grown along the inner facing surfaces of the notch. First and second gate electrodes 44 and 46 are then formed along the left and right vertical sides of the notch, as by shadow evaporation of conductive material such as aluminum from an angle or low pressure chemical vapor deposition (LPCVD) of polysilicon. Another insulating oxide layer 48 is provided along the facing sides of the gate electrodes and along the bottom of the upper notch section, as by chemical vapor deposition. Shielding electrode means 50 is then deposited in the notch and is insulated between the gate electrodes by insulating layer 48. The insulated gating and shielding structure in notches 24 and 26 is comparable.

Notch 22 extends from top major surface 12 downwardly through top layers 20 and 18 into substrate region 4. Notch 22 separates top layer 20 into first and second left and right source regions 52 and 54 and extends therebetween. Notch 22 separates top layer 18 into first and second regions 56 and 58 containing left and right channel regions 60 and 62 and extends therebetween. The substrate 4 around the notch forms a drain or drift region 64 of the substrate. Main electrode metalization 66 is deposited on top major surface 12 in an etched groove to ohmically contact source region 52 and channel containing region 56. Another main electrode metalization 68 is deposited on top major surface 12 in an etched groove to ohmically contact source region 54 and channel containing region 58.

Upon application of a positive voltage to left gate electrode 44 with respect to left main electrode 66, electrons in p region 56 are attracted to channel region 60 to invert the conductivity type therein to n type. This allows electron flow from n+ source region 52 through channel 60 into drift region 64 in substrate 4. If right main electrode 68 is positive with respect to left main electrode 66, current may then flow from p region 58 momentarily across forward biased PN junction 70 into drift region 64, then through channel 60 to source region 52 and electrode 66. As soon as current starts to flow through the FET, the voltage across main electrodes 68 and 66 starts to drop, which in turn reduces the potential in various regions of the FET, including portion 72 of p layer 58 adjacent the right FET channel 62. This falling potential causes carrier electron flow into right channel region 62 because portion 72 becomes negative relative to right gate electrode 46 at a given gate potential, whereby positive right gate electrode 46 attracts electrons into right channel region 62 to invert the conductivity type thereof to n type, and hence render channel 62 conductive. Forward biased PN junction 70 conducts only momentarily until the second channel 62 turns ON.

The main current path through FET 2 is from right main electrode 68 through right source region 54, downwardly through right vertical channel region 62 along the right side of notch 22, then further downwardly into drift region 64 along the right side of the notch, then around the bottom of notch 22, then upwardly along the left side of notch 22 in drift region 64 of substrate 4, then upwardly through left vertical channel region 60 along the left side of notch 22, then through left source region 52 to left main electrode 66.

The structure is bidirectional, and thus current may also flow from left main electrode 66 to right main electrode 68 when right gate 46 is positive with respect to right main electrode 68. Electrons in p layer region 58 are attracted into right channel region 62 by right gate 46 to thus invert channel region 62 to n type and hence allow electron flow from n+ source region 54 through channel 62 into drift region 64 in substrate 4. If left main electrode 66 is positive with respect to right main electrode 68, current then flows from p layer region 56 momentarily across forward biased PN junction 74 until channel 60 turns ON. The main current path is from left main electrode 66 through left source 52, through left channel 60, through drift region 64, through right channel 62, through right source 54 to right main electrode 68. Main electrode 68 thus serves as an electron current source when a negative voltage is applied thereto relative to the voltage on main electrode 66, and serves as an anode when a positive voltage is applied thereto relative to the voltage on main electrode 66.

The application of electrical gate potential to gate electrodes 44 and 46 enables them to produce electric fields of sufficient intensity to invert the conductivity type in the first and second channel regions 60 and 62. Upon application of voltage of either polarity to the first and second source regions 52 and 54, electric current can flow in a respective corresponding direction between them, under control of the electrical gate potential of the gate electrode means 44 and 46. The current flow between spaced apart regions 52 and 54 is controllable by controlling the electric fields in channel regions 60 and 62, which in turn are controllable by controlling the electric potential on the gate electrode means 44 and 46.

In the absence of gate potential on gate electrodes 44 and 46, channel regions 60 and 62 are p type, and the device is in a blocking OFF state. Current from left main electrode 66 to right main electrode 68 is blocked by junction 70. Current flow in the other direction from right main electrode 68 to left main electrode 66 is blocked by junction 74.

Bidirectional FET 2 may be used to control AC power. FIG. 1 schematically shows a load 76 and a source of AC power 78 connected across main electrodes 66 and 68. Gate electrode 44 is connected by a gate terminal 80 to a source of gate potential 82 through switch means 84. Gate electrode 46 is connected by a gate terminal 86 to a source of gate potential 88 through switch means 90. In the ON state of FET 2, switches 84 and 90 are in an upward position such that given polarity gate potential is applied to gate electrodes 44 and 46. The gate potential is higher than the most negative of the main electrodes in each half cycle.

When main electrode 68 is positive with respect to main electrode 66, as driven by AC source 78, gate electrode 44 is positive with respect to negative main electrode 66 connected to source region 52 and p layer region 56. Hence, channel 60 is inverted to n type and conduction occurs, i.e. current flows from positive main electrode 68 through source region 54, through channel 62, through drift region 64 around the bottom of notch 22 in substrate 4, through channel 60, through source 52 to negative main electrode 66 and through load 76.

In the other half cycle of AC source 78, main electrode 66 is positive with respect to main electrode 68, and gate electrode 46 is positive with respect to negative main electrode 68 connected to source 54 and p layer region 58. Conduction is thus enabled through channel 62, and current flows from positive left main electrode 66 through source 52, through channel 60, through drift region 64 around the bottom of notch 22 in substrate 4, through channel 62, to source 54 and right main electrode 68.

Shielding electrode means 50 prevents electric field divergence induced depletion in drift region portions 92 and 94, which in turn prevents unwanted inducement of conduction channels in the drift region during the OFF state. This enables the use of non-floating gates, i.e. the referencing of gate electrodes 44 and 46 to substantially the same potential level of one or more of the main electrodes in the OFF state of FET 2. In the OFF state of FET 2, switches 84 and 90 are in the downward position, connecting gate terminal 80 through reverse blocking diode 96 to main electrode 66, and connecting gate terminal 86 through reverse blocking diode 98 to main electrode 68.

In the OFF state of FET 2 and during the first half cycle of AC source 78, the voltage on right main electrode 68 rises positively with respect to left main electrode 66. Junction 70 is forward biased and thus the potential level in drift region 64 of substrate 4 is at substantially the same level as right main electrode 68. Left gate electrode 44 is relatively negative since it is tied through diode 96 to left main electrode 66 and the other side of the AC source. There is thus an electric field gradient established between right substrate region 94 and the left gate electrode 44. The potential level along the left side of notch 22 in substrate 4 is at a very low level and increases as one moves vertically downwardly along the left edge of notch 22. The electric field gradient between the left and right edges of notch 22 causes attraction of given polarity carriers from substrate 4 into right notch edge substrate region 94.

As the positive voltage on right main electrode 68 rises higher, right drift region portion 94 becomes more positively biased relative to left gate electrode 44, and the electric field gradient causes attraction of holes toward, and depletion of electrons away from, drift region portion 94. If the carrier concentration becomes great enough, the conductivity type of portion 94 is inverted to p type such that conduction occurs through an induced p channel along portion 94 around notch 22. A conduction channel so formed extends around to the left side of the notch, and junction 74 loses its reverse blocking ability, whereby FET 2 can no longer block voltage in its OFF state from source 78.

Shielding electrode 50 is connected by terminal 102 to substrate 4 to be at substantially the same potential level thereof, namely within one junction drop of main electrodes 66 and 68 across junctions 74 and 70. As the potential of right main electrode 68 rises, so also does the potential level in substrate portion 94 due to the single junction drop thereto across forward biased junction 70. The potential of shielding electrode 50 also rises due to connection 102. Shielding electrode 50 is insulated between left gate electrode 44 and right drift region portion 94 to thus shield the latter from the electric field gradient of the left gate electrode 44. Shield 50 thus prevents an electric field gradient from being established at drift region portion 94 of the substrate, whereby to prevent attraction of holes to the right edge of notch 22 at portion 94 below junction 70. As the potential level in drift region portion 94 rises, so does the potential level of shield 50, whereby the relatively negative left gate electrode 44 no longer affects the conductivity characteristics of drift region portion 94. Shield 50 thus prevents unwanted inducement of conduction channels in the drift region during the OFF state.

During the second half cycle of AC source 78, and during the OFF state of FET 2, left main electrode 66 rises positively with respect to right main electrode 68. As the potential of left main electrode 66 becomes greater, so does the potential level of drift region portion 92 of the substrate due to the single junction drop thereto across forward biased junction 74. Shield 50 also rises positively due to connection 102 to substrate 4. This potential rises positively with respect to right gate electrode 46 which is connected to negative right main electrode 68 through diode 98. If the applied voltage becomes great enough, the relatively negative right gate electrode 46 would establish a large enough electric field gradient across notch 22 to effect conductivity inversion and induce a conduction channel in drift region portion 92. Shield 50 prevents this unwanted inducement of conduction channels during the OFF state in the drift region. Shield electrode 50 is between right gate electrode 46 and left substrate drift region portion 92 and is at substantially the same potential level as left main electrode 66, and thus shields drift region portion 92 from electric field gradients caused by right gate electrode 46.

Higher OFF state voltage blocking capability is further afforded by the increased drift region current path length. The current path between the main electrodes extends from each source region downwardly through the channel regions and downwardly and around the bottom 34 of the notch. This increases the drift region current path length and affords higher OFF state voltage blocking capability without increasing the lateral dimension along top major surface 12, whereby to afford high density, high voltage bidirectional FET structure with relatively low ON state resistance.

As seen in FIG. 1, a plurality of FETs are afforded in the integrated structure. Top layers 20 and 18 are further split into respective left and right source regions and channel regions by respective notches 24 and 26. Main electrode metalizations are provided comparably to that described, and connected in series in the AC load line, or in parallel as shown in FIG. 1. Left gate electrodes 104 and 106 are connected in parallel with gate electrode 44 to gate terminal 80. Right gate electrodes 108 and 110 are connected in parallel with gate electrode 46 to gate terminal 86. Shielding electrodes 112 and 114 are connected in parallel with shielding electrode 50 to terminal 102.

Main electrode 68 provides the source electrode for the FET to the left around notch 22, and also provides the source electrode for the FET to the right around notch 24. Main electrode 116 provides the drain electrode for the FET around notch 24, and also provides the drain electrode for the FET around notch 26. In the other half cycle of AC source 78, the roles of electrodes 68 and 116 are reversed, i.e. electrode 68 is the drain for its left and right FETs around respective notches 22 and 24, and electrode 116 is the source for its left and right FETs around respective notches 24 and 26. Alternate main electrodes 66, 116 and so on, are thus connected to one side of the AC source, and the other alternate main electrodes 68, 118 and so on, are connected to the other side of the AC source.

Notwithstanding the above described features affording increased OFF state voltage blocking capability, it is still desirable to protect the reverse blocking junctions 70 and 74 in the OFF state. To this end, integral barrier junctions 120 and 122 provide desired protection against avalanche breakdown of junctions 70 and 74. As the potential on right main electrode 68 rises, so also does the potential on right isolation region 16, due to connection terminal 124. Junction 122 between isolation region 16 and the bottom common p layer 6 is thus reversed biased and blocks current. Bottom p layer 6 is doped lower than top p layer 18, and junction 122 has a lower reverse breakover threshold than junction 74.

In the event of overvoltage on right main electrode 68, junction 122 will thus reverse breakover and conduct before junction 74 conducts. Upon conduction of junction 122, current flows from AC source 78 through terminal 124, through right isolation region 16, across reverse broken-over junction 122, through bottom common p layer 6, across forward biased junction 120, through left isolation region 14, through terminal 126 back to the AC source. This current path between the main electrodes is in parallel to the FET current path between the main electrodes across junctions 70 and 74.

In the other half cycle, if the rising potential on left main electrode 66 reaches an overvoltage condition, reverse biased junction 120 breaks over before blocking junction 70, such that the alternate bypass parallel current path through isolation regions 14 and 16 and bottom p layer 6 conducts, and thus protects reverse blocking junction 70 from avalanche breakdown.

There are numerous alternative structures to that in FIG. 1. Instead of each main electrode such as 68 extending downwardly from top major surface 12, main electrode 68 may be disposed on top of surface 12 and contact spaced n+ diffused tub regions 54 and 128, with p region 58 extending upwardly in area 130 to the top major surface 12 between n+ regions 54 and 128.

Figure 2:
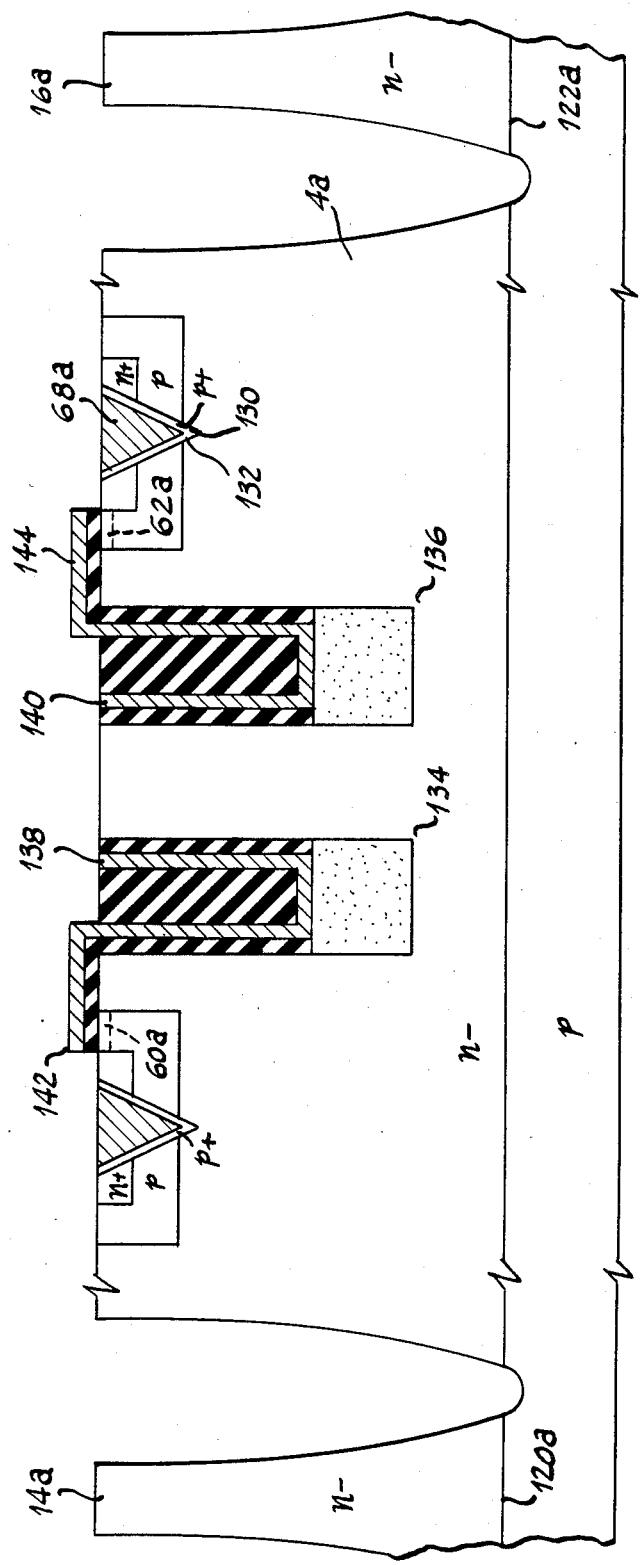
FIG. 2 is a schematic sectional view of an alternate embodiment of FIG. 1.

In another alternative, FIG. 2, main electrode 68a may extend downwardly through the top n+ layer and also through the top p layer into substrate 4a, and include a p+ layer 130 therealong forming a junction 132 with substrate 4a. FIG. 2 uses like reference numerals as FIG. 1 with the postscript "a" where appropriate to facilitate clarity.

In another alternative, notch means may be provided by two notches 134 and 136, instead of a single notch 22. A left gate electrode 138 in the left notch corresponds to gate electrode 44, and a right gate electrode 140 in the right notch corresponds to gate electrode 46. Each gate electrode 138 and 140 acts as the other's shield to afford the shielding function above described.

In another alternative, lateral channels 60a and 62a are provided instead of the vertical channels 60 and 62. The notches may be eliminated. If notch means is used, the gate electrodes include portions extending horizontally at 142 and 144 insulated above and in close proximity to the channels. Split gate electrode means is preferred, though a single gate may be used, extending across both channels, either with a notch and having vertical channels, or without a notch and having horizontal channels. The integral avalanche protection means in FIG. 2 provided by isolation regions 14a and 16a and bottom common p layer 6a together with junctions 120a and 122a protects the reverse blocking junctions in these above described bidirectional power FETs.

It is recognized that various modifications are possible within the scope of the appended claims.

I claim:

1. A bidirectional FET, comprising:
  a first source region of one conductivity type semiconductor material;
  a first channel region of opposite conductivity type semiconductor material forming a junction with said first source region;
  a single drift region of said one conductivity type semiconductor material forming another junction with said first channel region;
  a second channel region of said opposite conductivity type semiconductor material forming a junction with said drift region;
  a second source region of said one conductivity type semiconductor material forming a junction with said second channel region;
  gate electrode means disposed proximate said first and second channel regions and adapted for application of electrical potential for producing electric fields of sufficient intensity to invert the conductivity type in at least a portion of said first and second channel regions;
  whereby upon application of voltage of either polarity to said first and second source regions, electric current can flow in a respective corresponding direction between them, under control of said electrical potential of said gate electrode means;
  said FET having an OFF state in the absence of said electric gate potential, with the junction between said drift region and one of said channel regions blocking current flow toward one of said source regions, and with the junction between said drift region and the other of said channel regions blocking current flow toward the other of said source regions, said single drift region supporting OFF state blocking voltage in both directions; and
  integral avalanche protection means in parallel with said last mentioned blocking junctions and having a lower reverse breakover threshold for protecting the latter in said OFF state;
  wherein said integral avalanche protection means comprises:
  first and second isolation regions of said one conductivity type laterally spaced and separated from said source regions, channel regions and drift region by respective isolation moats, and means connecting each of said first and second isolation regions to a respective on of said source regions; and
  a common region of said opposite conductivity type forming bypass junctions with said first and second isolation regions to provide an integral bypass current path around said blocking junctions between said channel regions and said drift region, said bypass junctions having a lower reverse breakover voltage threshold than said blocking junction.

2. The invention according to claim 1 comprising first and second main electrode means each connected to a respective source region and channel region, each said main electrode means also connected to a respective one of said isolation regions, said bypass junctions being in a parallel circuit around said blocking junctions between said main electrodes.

3. The invention according to claim 2 wherein said common region of said opposite conductivity type forms a junction with said drift region.

4. The invention according to claim 3 wherein said isolation regions are isolated from said source regions, said channel regions and said drift region by respective isolation moats extending downwardly from a top major surface into said commom region of said opposite conductivity type, the latter extending laterally below said drift region and said isolation regions.

5. The invention according to claim 4 wherein said gate electrode means comprises split gate electrode means comprising a first gate electrode disposed proximate said first channel region and a second gate electrode disposed proximate said second channel region.

6. The invention according to claim 5 comprising notch means extending between and separating said first and second source regions and said first and second channel regions, and extending into said drift region.

7. The invention according to claim 6 wherein said channel regions are laterally spaced by said notch means, and said notch means extends downwardly from said top major surface of said FET, said channel regions extending generally vertically along respective sides of said notch means, said drift region being below said channel regions, wherein said notch means extends downwardly into said drift region a substantial distance below said gate electrode means to substantially diminish attraction carriers by said gate electrode means from said drift region toward the edges of said notch means, to prevent unwanted inducement of conduction channel in the OFF state and afford higher OFF state voltage blocking capability.

8. The invention according to claim 7 wherein said source regions are laterally spaced along said top major surface by said notch means therebetween, said source regions being above respective said channel regions, wherein the portion of said notch means below said gate electrode means comprises anodized single crystalline porous silicon oxidized to a substanitally insulative condition.

9. The invention according to claim 6 wherein said notch means comprises first and second spaced notches extending between said first and second source regions and said first and second channel regions, said first gate means being in said first notch and including a portion proximate said first channel region, said second gate means being in said second notch and including a portion proximate said second channel region.

10. The invention according to claim 8 wherein the drift region current path between said main electrodes extends from said source regions downwardly through said channel regions and downwardly and around the bottom of said notch means.

11. The invention according to claim 6 wherein said channel regions extend horizontally along a top major surface between a respective said source region and said drift region, and said portions of said split gate electrode means extend horizontally along said top major surface above respective said channel regions.

12. The invention according to claim 6 comprising shielding means in said notch means insulated between said first and second gate means for preventing electric field gradient induced depletion in said drift region along said notch means in said OFF state, to prevent unwanted inducement of conduction channels.

13. The invention according to claim 12 wherein each of said first and second gate electrode means is connected to a substantially common potential level with a respective one of said main electrodes in said OFF state of said FET, said shielding means being connected to substantially the same potential level as said main electrodes such that in said OFF state the potential of said shielding means is substantially the same as the potential in said drift region along the edge of said notch below the respective said channel region, whereby said shielding means shields said last mentioned notch edge drift region portion from electric field gradients from the gate electrode means along the opposite notch means edge, to thus prevent attraction of given polarity carriers in said drift region towards the edges of said notch means, to prevent electric field gradient induced depletion and hence prevent unwanted inducement of conduction channels in said drift region during said OFF state.

14. A bidirectional lateral power FET, comprising:
a substrate of semiconductor material of one conductivity type having a top major surface;
a pair of channel regions of the other conductivity type laterally spaced in said substrate;
a pair of source regions of said one conductivity type laterally spaced along said top major surface and each forming a junction with a respective one of said channel regions;
a pair of main electrodes each connected to a respective said source region and channel region;
notch means in said substrate extending downwardly from said top major surface between said source regions and said channel regions into a single drift region in said substrate, such that the conductive current path is directed from one source region through one said channel region, then into said drift region and downwardly along one side of said notch means, then around the bottom of said notch means, then upwardly through said drift region along the other side of said notch means, then through the said other channel region to said other source region, with the same path conducting current in the reverse direction, said single drift region around said notch supporting OFF state blocking voltage in both directions;
insulated gate means in said notch means including portions proximate said channel regions for attracting given polarity carriers to invert said channel regions to said one conductively type in response to given gate potential, such that current may flow in either direction between said main electrodes;
a bottom layer of said other conductivity type below said drift region portion of said substrate and forming a junction therewith;
a pair of isolation regions of said one conductivity type laterally spaced and isolated from said source regions, channel regions and drift region by respective isolation moats extending downwardly from said top major surface into said bottom layer, each isolation region forming a junction with said bottom layer and having a reverse breakover threshold lower than the reverse breakover of the respective junctions formed between said channel regions and said drift region, each said isolation region connected to a respective one of said main electrodes to provide a protective bypass current path in parallel with said first mentioned condutive current path between said main electrodes.

15. The invention according to claim 14 wherein:
said main electrodes are connectable to an AC load line;
said gate electrode means is connectable to gate potential source means;
such that said gate electrode means is positive with respect to one of said main electrodes during the first half cycle of said AC line, and is positive with respect to the other of said main electrodes during the second half cycle of said AC line;
such that during the first half cycle of said AC line, current flows from said other main electrode through said other source region, through said other channel region, through said substrate drift region around the bottom of said notch, through said one channel region, through said one source region to said one main electrode; and
such that during the second half cycle of said AC line, current flows from said one main electrode through said one source region, through said one channel region, through said substrate drift region around the bottom of said notch, through said other channel region, through said other source region to said other main electrode.

16. The invention according to claim 15 wherein said FET has an OFF state in the absence of said given gate potential,
the junction between said substrate drift region and said one channel region blocking current flow toward said one main electrode in said OFF state,
the junction between said substrate drift region and said other channel region blocking current flow toward said other main electrode in said OFF state,
said junction between said other isolation region and said bottom layer normally blocking current flow toward said one main electrode in said OFF state and having a lower reverse breakover threshold than said junction between said substrate drift region and said one channel region so as to conduct before the latter in the event of high OFF state voltage across said main electrodes, said junction between said one isolation region and said bottom layer normally blocking current flow toward said other main electrode in said OFF state and having a lower reverse breakover threshold than said junction between said substrate drift region and said other channel region so as to conduct before the latter in the event of high OFF state voltage between said main electrodes.

17. The invention according to claim 16 wherein:

during said first half cycle of said AC line, current flows from said other main electrode momentarily across a forward biased junction therebelow between said other channel region and said substrate drift region, and rhen flows through said one channel region to said one source region and said one main electrode, the falling potential in said substrate across said forward biased junction relative to said gate electrode means causing said gate electrode means to attract given polarity carriers to said other channel region to invert the latter to said one conductivity type, such that the main current path during said first half cycle is from said other main electrode through said other source region, through said other channel region, through said substrate drift region around the bottom of said notch means, through said one channel region, through said one source region to said one main electrode; and such that during the second half cycle of said AC line, current flows from said one main electrode momentarily across a forward biased junction therebelow between said one channel region and said substrate drift region and then flows through said other channel region to said other source region and said other main electrode, the falling potential in said substrate across said last mentioned forward biased junction relative to said gate electrode means to attract given polarity carriers to said one channel region to invert the latter to said one conductivity type, such that the main current path during said second half cycle is from said one main electrode through said one source region, through said one channel region, through said substrate drift region around the bottom of said notch means, through said other channel region, through said other source region to said one main electrode.

18. The invention according to claim 17 wherein said gate means comprises split gate electrode means comprising first insulated gate means in said notch proximate said first channel region, and second insulated gate means in said notch means proximate said second channel region, wherein said notch extends downwardly into said drift region a substantial distance below said first and second gate means to substantially diminish attraction of carriers by said first and second gate means from said drift region toward the edges of said notch, to prevent unwanted inducement of conduction channel in the OFF state and afford higher OFF state voltage blocking capability.

19. The invention according to claim 18 comprising:

shielding means in said notch means insulated between said first and second gate electrode means to shield the portion of said substrate drift region along the edge of said notch means from electric field gradients from the gate electrode means along the opposite edge of said notch means, and prevent depletion and unwanted inducement of conduction channels in said drift region during said OFF state of said FET;

and wherein:

said first gate electrode means is referenceable in said OFF state to substantially the same level as said one main electrode;

said second gate electrode means is referenceable in said OFF state to substantially the same potential level as said other main electrode;

during said first half cycle in said OFF state, said junction between said other channel region and said substrate drift region is forward biased such that the potential in said drift region is substantially the same as the potential on said other main electrode, said first gate electrode means being at substantially the same potential level as said one main electrode, said shielding means being at substantially the same potential level as said other main electrode, said shielding means being between said first gate electrode means and the portion of said drift region along the edge of said notch means below said other channel region whereby to shield said last mentioned drift region portion from the electric field gradient from said first gate electrode means otherwise causing attraction of given polarity carriers in said last mentioned drift region portion to said edge of said notch means below said other channel region causing unwanted depletion and inducement of conduction channels;

during said second half cycle in said OFF state, said junction between said one channel region and said substrate drift region is forward biased such that the potential in said drift region is substantially the same as the potential on said one main electrode, said second gate electrode means being at substantially the same potential level as said other main electrode, said shielding means being at substantially the same potential level as said one main electrode, said shielding means being between said second gate electrode means and the portion of said drift region along the edge of said notch means below said one channel region whereby to shield said last mentioned drift region portion from the electric field gradient from said second gate electrode means otherwise causing attraction of given polarity carriers in said last mentioned drift region portion to said edge of said notch means below said one channel region causing unwanted depletion and inducement of conduction channels.

* * * * *

UNITED STATES PATENT AND TRADEMARK OFFICE
CERTIFICATE OF CORRECTION

PATENT NO. : 4,577,208
DATED : March 18, 1986
INVENTOR(S) : HERMAN P. SCHUTTEN ET AL It is certified that error appears in the above-identified patent and that said Letters Patent is hereby corrected as shown below:

In Column 2, line 13, after "p type" delete "," (comma) and insert --.-- (period)

In Claim 1, column 8, line 21, delete "on" and insert --one--

In Claim 4, column 8, line 43, delete "commom" and insert --common--

In Claim 7, column 8, line 66, delete "channel" and insert --channels--

In Claim 14, column 10, line 14, delete "conductively" and insert --conductivity--

In Claim 14, column 10, line 27, after "breakover" insert --threshold--

In Claim 14, column 10, line 32, delete "condutive" and insert --conductive--

In Claim 17, column 11, line 20, delete "rhen" and insert --then-

Signed and Sealed this

Fifteenth Day of July 1986

[SEAL]

Attest:

DONALD J. QUIGG

Attesting Officer    Commissioner of Patents and Trademarks